(12) United States Patent
Aliahmad et al.

(10) Patent No.: US 6,794,920 B1
(45) Date of Patent: Sep. 21, 2004

(54) SAMPLED ANALOG DC OFFSET CORRECTION FOR DATA BUS STRUCTURES

(75) Inventors: Mehran Aliahmad, Ottawa (CA); Kristopher Kshonze, Ottawa (CA); Russell W. Brown, Nepean (CA)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/569,036

(22) Filed: May 11, 2000

(51) Int. Cl.[7] ............................... H03K 5/08
(52) U.S. Cl. .................. 327/307; 327/309; 330/149
(58) Field of Search ..................... 327/307, 309; 360/46, 67; 340/347; 375/326, 296; 341/118; 330/9, 149

(56) References Cited

U.S. PATENT DOCUMENTS

| | | | | |
|---|---|---|---|---|
| 4,282,515 A | * | 8/1981 | Partterson, III | 340/347 |
| 4,535,371 A | * | 8/1985 | Harr et al. | 369/67 |
| 4,953,041 A | * | 8/1990 | Huber | 360/46 |
| 4,972,189 A | * | 11/1990 | Polito et al. | 341/118 |
| 5,392,039 A | * | 2/1995 | Thurston | 341/143 |
| 5,517,141 A | * | 5/1996 | Abdi et al. | 327/96 |
| 6,222,891 B1 | * | 4/2001 | Lui et al. | 375/326 |
| 6,356,218 B1 | | 3/2002 | Brown et al. | 341/120 |

* cited by examiner

Primary Examiner—Tuan T. Lam
Assistant Examiner—Hiep Nguyen
(74) Attorney, Agent, or Firm—Myers Bigel Sibley & Sajovec

(57) ABSTRACT

A circuit for measuring and compensating for DC offset introduced into a differential signal due to, for example, terminator mismatches and interconnect resistance, is described herein. The circuit includes a plurality of capacitors that store test values of a differential signal, a summer, a comparator, a digital counter, and an analog-to-digital converter. The summer sums signals from the plurality of capacitors and a dc offset correction signal from the analog-to-digital converter. A differential output from the summer is processed by the comparator to generate a binary output signal that is used to recursively modify the value of the dc offset correction signal until the dc offset correction signal stabilizes.

26 Claims, 6 Drawing Sheets

SAMPLED ANALOG DC OFFSET CORRECTION FOR DATA BUS STRUCTURES

BACKGROUND OF THE INVENTION

1. Field of the Invention

Aspects of the invention relate to parallel data bus structures. Other aspects relate to the detection and correction of DC offset incorporated in a digital data signal as it is transmitted over a parallel data bus.

2. Description of Background Information

In a computer environment, a parallel data bus typically provides the main communication link between CPUs and peripheral devices such as disk drives, printers, scanners, and any other device requiring access to the bus for transmitting and receiving information. The maximum length of the bus as well as the maximum number of peripheral devices that can be connected to the bus is dictated by a protocol that corresponds to the type of bus used. In addition to these parameters, the protocol also specifies the maximum rate at which data can be transmitted across the bus.

One such parallel data bus is the Small Computer System Interface (SCSI). SCSI is a set of ever changing electronic interface standards/protocols that allow faster and more flexible parallel communication between computers and peripheral hardware over previous interfaces. For example, the Ultra-3 SCSI standard/protocol specifies a bus that can be 12 meters in length, connect up to 16 devices, and transmit data at a rate of 160 Mbytes per second (40 MHz). A list of the various adopted SCSI standards/protocols and their main attributes are summarized in TABLE 1.

TABLE 1

| SCSI Standard | Maximum Cable Length (m) | Maximum Speed (Mbytes/sec) | Maximum Number of Devices |
|---|---|---|---|
| SCSI-1 | 6 | 5 | 8 |
| SCSI-2 | 6 | 5–10 | 8 or 16 |
| Fast SCSI-2 | 3 | 10–20 | 8 |
| Wide SCSI-2 | 3 | 20 | 16 |
| Fast Wide SCSI-2 | 3 | 20 | 16 |
| Ultra SCSI-3, 8-bit | 1.5 | 20 | 8 |
| Ultra SCSI-3, 16-bit | 1.5 | 40 | 16 |
| Ultra-2 SCSI | 12 | 40 | 8 |
| Wide Ultra-2 SCSI | 12 | 80 | 16 |
| Ultra-3 (Ultra160/m) SCSI | 12 | 160 | 16 |

The SCSI standard is subject to the same signal distortion and interference that is seen in most digital transmission devices. Examples of interference that affect communications between devices on a SCSI parallel data bus include inter-symbol interference (ISI), noise coupled to the transmission line from external sources, and DC offset, which is the phenomenon of a DC voltage being added to a transmitted signal either by the transmitter or by the signal path. This interference can result in the unreliable detection of data by a receiver.

When data transmission speeds are increased, the frequency content is also increased. When a signal with a high data rate is transmitted over a finite bandwidth medium, its amplitude is attenuated. As an example, consider a non-return to zero (NRZ) SCSI signal propagating at 80 MHz (320 Mbytes/s) over a distance of ten meters. Attenuation of this signal can reach up to twelve decibels; i.e., only ¼ of the amplitude of the original signal reaches its destination.

In a SCSI environment, the transmitted signal faces random DC offsets estimated at ± 100 mV. While the amplitude of the signal is attenuated, the DC offsets are not, and they represent a significant portion of the received signal. As a consequence, erroneous bit detection may occur at the receiver. If the original amplitude of the signal in the above example is 500 mV and the transmitter introduces a 50 mV DC offset, this only results in a 10% error. However, this same signal at the receiver after traversing the SCSI data bus and experiencing a 12 decibel attenuation has an amplitude of 125 mV. Now, the 50 mV DC offset constitutes a 40% error.

FIG. 4 shows an overall system block diagram of a conventional SCSI system. A host 420 and various hardware devices 440a ... 440m are coupled to a parallel data bus 400 via channel interface units 405a ... 405m. Hardware devices 440a ... 440m include CD ROM record/playback devices, scanners, disk drives, printers, or any other peripheral device designed for communication via parallel bus 400. Channel interface units 405a ... 405m facilitate the connection of the individual devices, e.g., host 420 and hardware devices 440a ... 440m, to the a respective lines of the parallel data bus 400 from whence information, e.g. digital data in the form of an oscillating signal over each line, is received.

FIG. 1A and FIG. 1B illustrate the concept of DC offsets. FIG. 1A shows a graph of two signals, [ap sin($\omega$t)+dp] 104 and [am sin($\omega$t)+dm] 106, that comprise a differential signal [ap sin(($\omega$t)+dp−(am sin($\omega$t)+dm)] 102, where dp and dm are the DC offsets associated with each signal. As is shown, dp=dm=0 in FIG. 1A; hence the DC offset is zero. In FIG. 1B, the signals 102, 104 and 106 are shown with a DC offset introduced. When signals 104 and 106 are combined to produce the differential signal 102, the DC offset represents 12.5% of the peak-to-peak amplitude, as is shown. If this signal suffers 12 decibels of attenuation during transmission, the DC offset will prevent the receiver comparator from switching during transitions, as there is sufficient DC offset for the single ended signals never to cross each other, i.e., the transmitted information can not be detected and is lost.

The low voltage differential (LVD) signaling scheme currently used to detect SCSI signals compensates for dc offset introduced by terminator circuits to ensure deassertion on a floating or idle bus. However, this compensation technique does not sense and correct actual signal path offset.

Therefore, a need exists for a novel/improved apparatus and method that will mitigate the DC offset that an information signal experiences as a result of its transmission across a parallel data bus (e.g., a SCSI parallel data bus) between devices.

BRIEF DESCRIPTION OF THE DRAWINGS

The above and other objects, features, and advantages of the present invention are further described in the detailed description which follows, with reference to the drawings by way of non-limiting exemplary embodiments of the present invention, wherein:

FIG. 6 illustrates, in schematic form, an apparatus 600, which comprises a SCSI interface 602 coupled to a DC offset correction circuit 604. DC offset correction circuit 604 may be as shown in FIG. 2, and may comprise a pair of input lines 244 and 246 which are connected to a first connection and to a second connection of a given pair of wires or pins of SCSI interface 602. For example, the first and second input lines of DC offset correction circuit 604 may be connected to the first and second wires/pins of differential signal line pair dp1, as shown in FIG. 5. As described above, a SCSI interface may comprise eight pairs of connections.

DETAILED DESCRIPTION

Commonly assigned U.S. Pat. No. 6,356,218 and application no. 09/568,504 upon which such patent is based are hereby expressly incorporated by reference herein in their entireties. An alternate embodiment is disclosed in these references for correcting DC offset in parallel data bus structures.

The embodiments as described below may be implemented with one or a combination of software, firmware, and hardware. Hence, the operation and behavior of the embodiments will be described without specific reference to, e.g., software code or specialized hardware components.

Figure 1A:
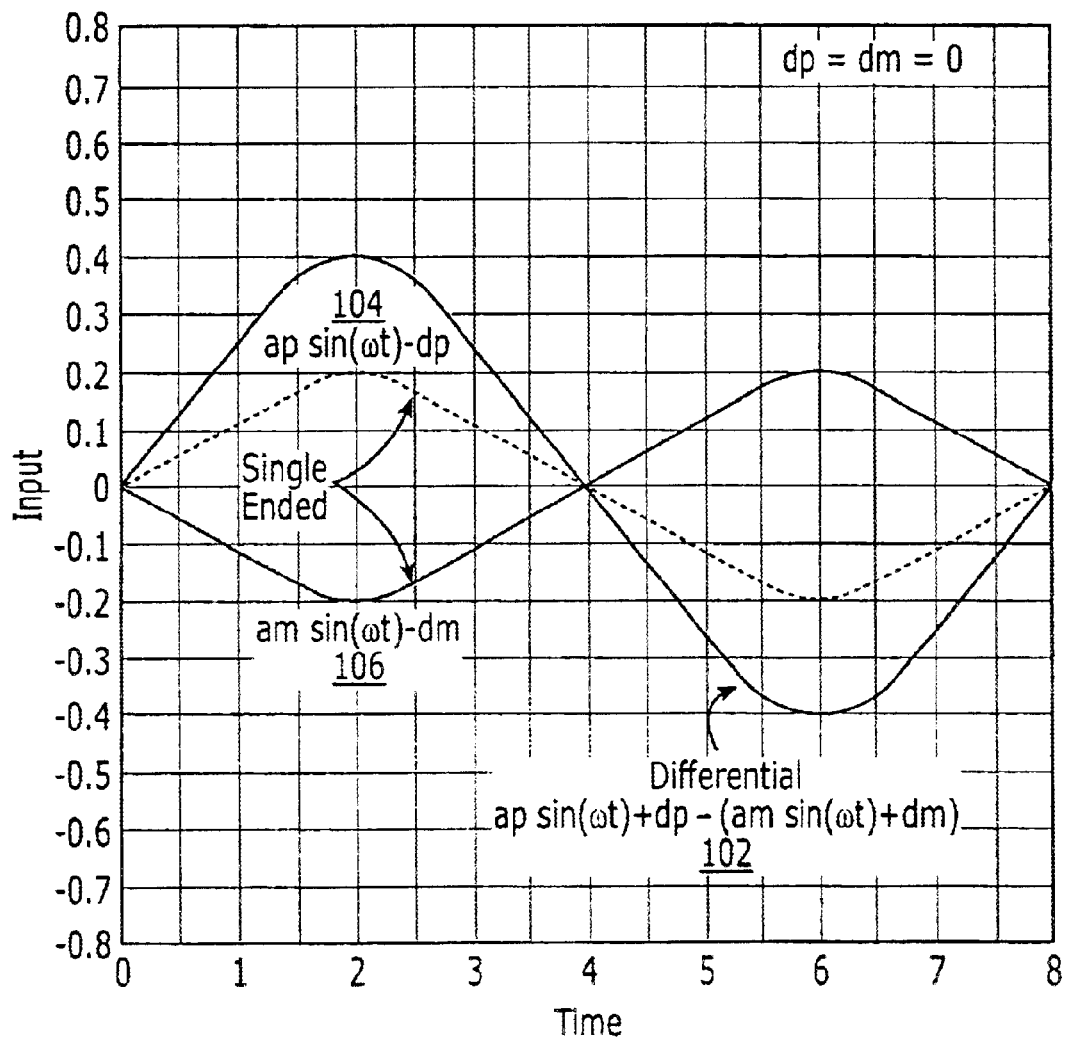
FIG. 1 illustrates the concept of DC offset in single ended signals and differential signals.
Figure 1B:
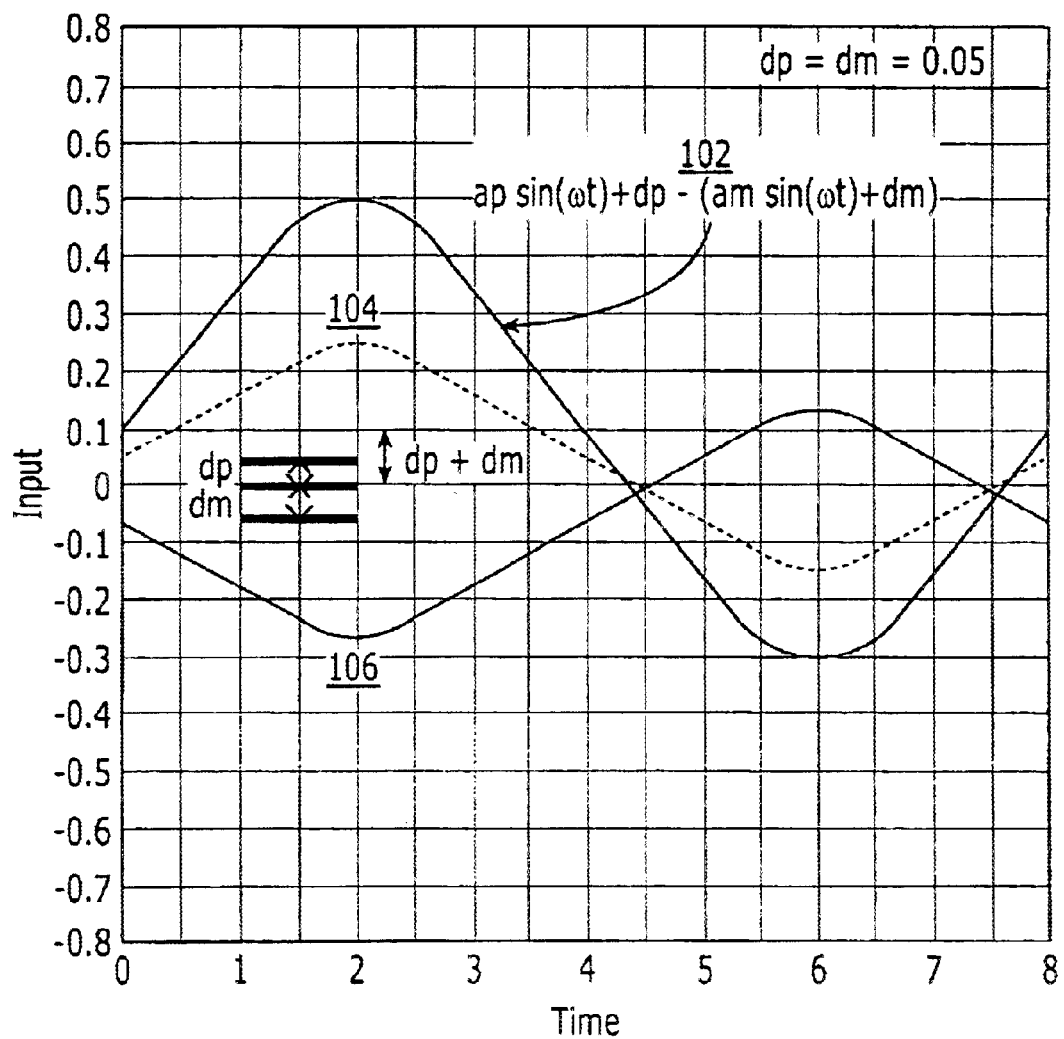
Figure 2:
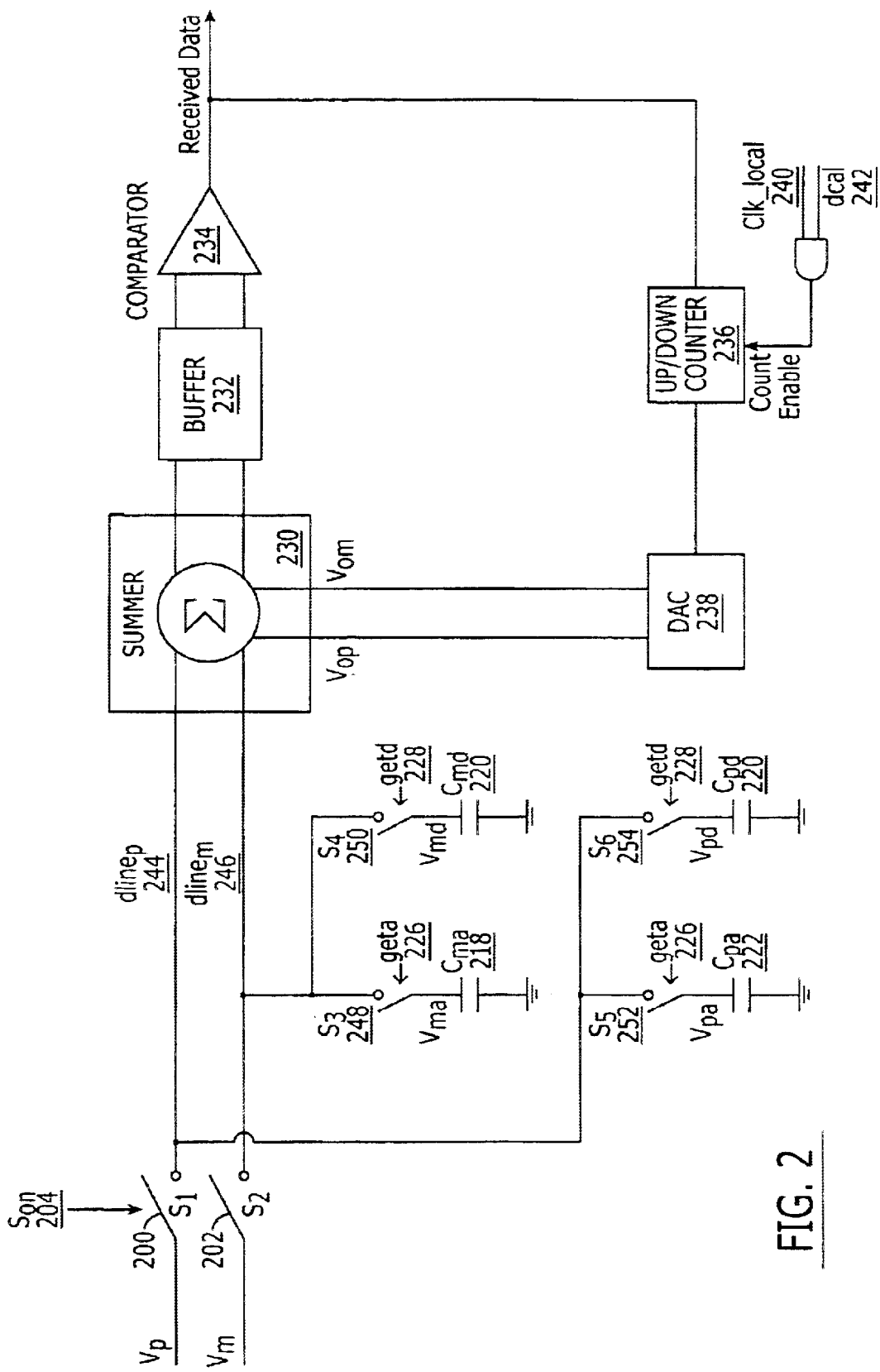
FIG. 2 shows a high-level functional block diagram of an embodiment of the DC offset correction apparatus.

An embodiment of the present invention is depicted by the high-level functional block diagram of FIG. 2, which illustrates SCSI receiver input circuitry implemented in host 420 or hardware devices 440a . . . 440m. The signal path includes an input buffer 232 and a comparator 234 to convert a received differential signal $V_p - V_m$ to a data pattern (received data) at normal logic levels. The capacitors $C_{ma}$ 218; $C_{md}$ 220; $C_{pa}$ 222; $C_{pd}$ 224, and switches $S_1$ 200; $S_2$ 202; $S_3$ 248; $S_4$ 250; $S_5$ 252; $S_6$ 254 are used to sample and hold the asserted and de-asserted input signal levels during a specific calibration training pattern. In this specific example, the capacitors are all of the same value (e.g., 2pF). Switches 200, 202, and 248 through 254 may be, for example, MOSFET switches.

As described below, signals sampled by the capacitors 218 through 224 are used to determine the offset component of the input signal applied to the receiver input ($dline_p$ 244, $dline_m$ 246) during an offset correction cycle. An offset correction loop for canceling the offset component includes an Up/Down Counter 236, a digital-to-analog converter (DAC) 238, and a summer 230. A DC correction voltage, ($V_{op} - V_{om}$), from DAC 238 is added to the received signal, ($dline_p$ 244–$dline_m$ 246), by summer 230 in order to cancel the signal path offsets. The offset correction loop in FIG. 2 is configured to correct all receive signal path offset errors, including the offset component of the applied signal ($V_p - V_m$), plus the offset errors in the receiver blocks, for example, the summer 230, buffer 232, and comparator 234 in FIG. 2.

Figure 3:
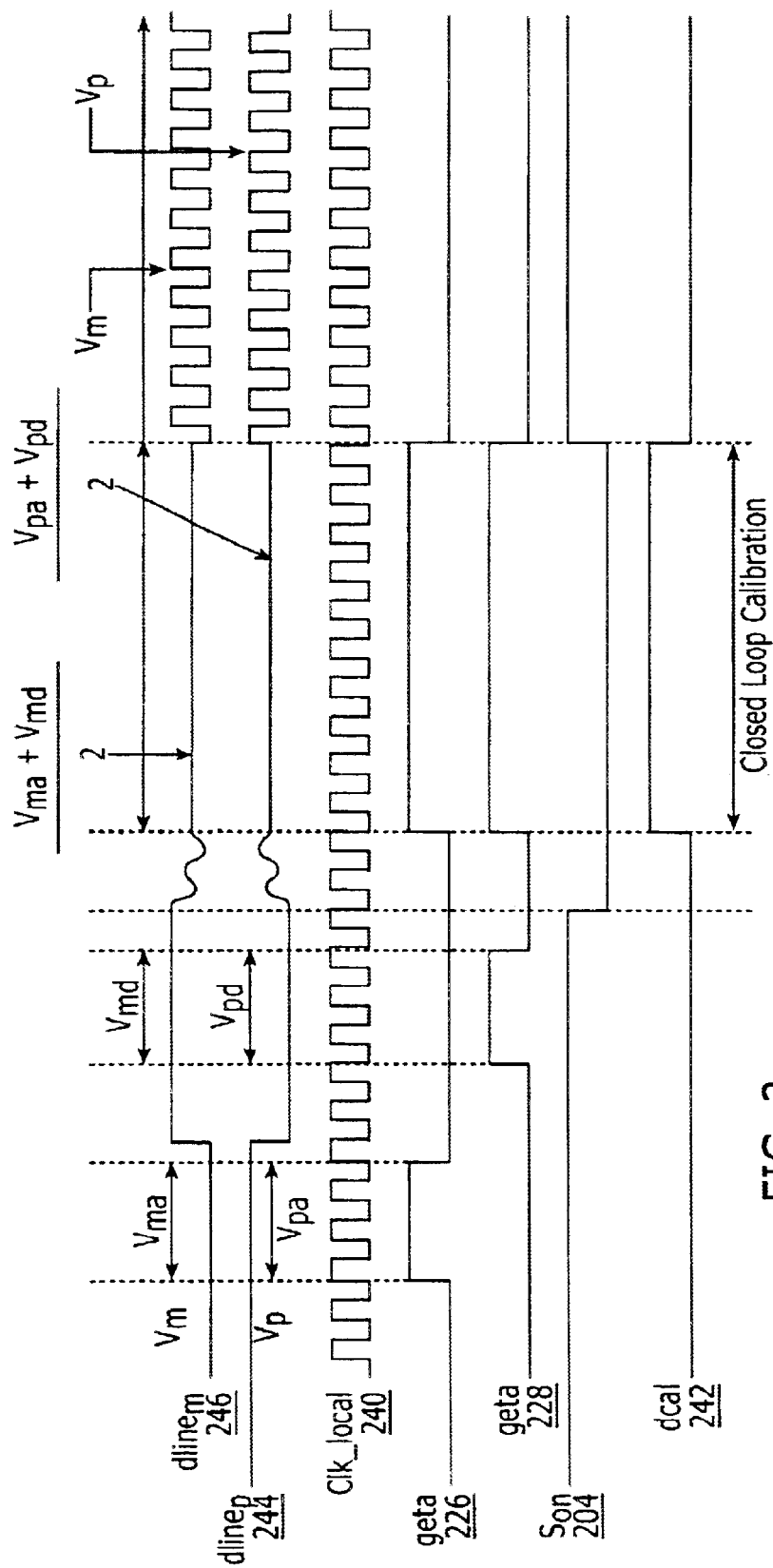
FIG. 3 is a timing diagram of the control signals used with the embodiment of the invention shown in FIG. 2.
Figure 4:
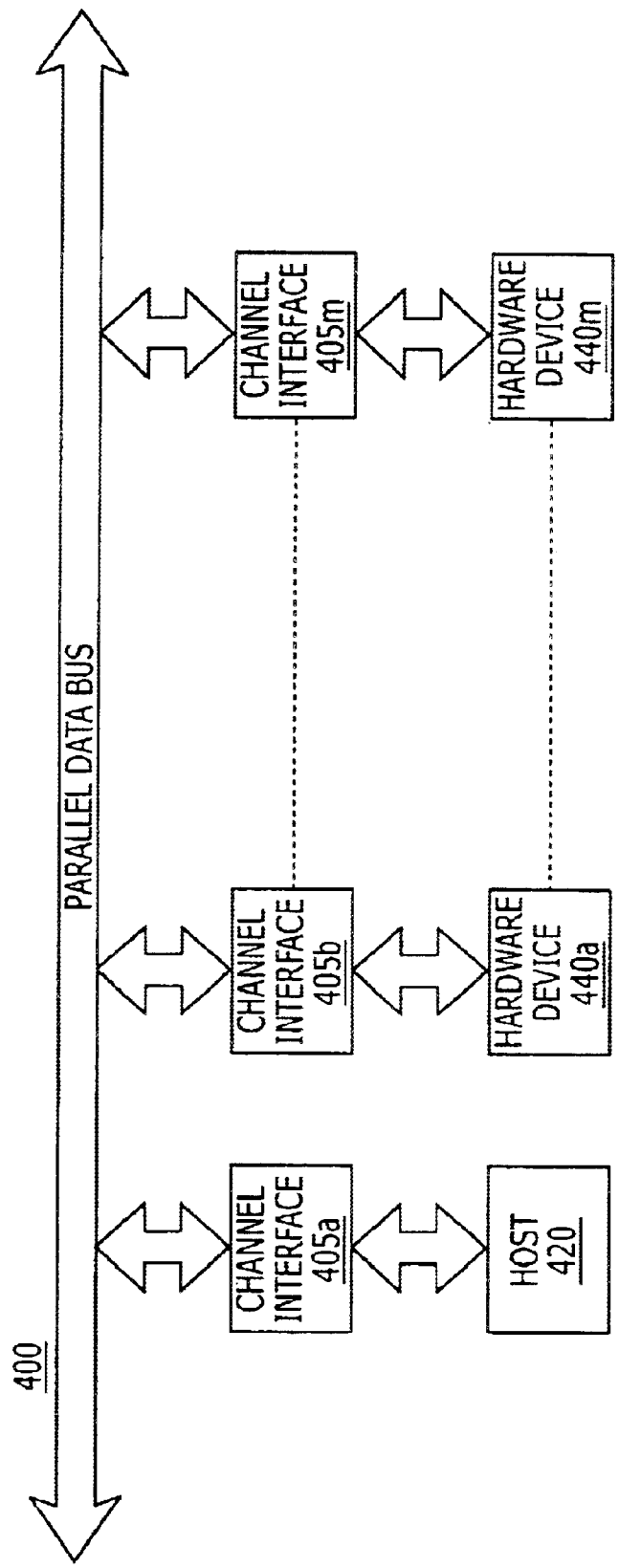
FIG. 4 is a high-level system block diagram of a SCSI system.

A timing diagram of the control signals used in conjunction with the illustrated embodiment is shown in FIG. 3. Initially, control signal $S_{on}$ 204 is asserted, causing switches $S_1$ 200 and $S_2$ 202 to close. A low frequency training pattern, such as 111 . . . 111000 . . . 000, where the "1's" indicate asserted and the "0's" indicate de-asserted, is received on the receiver inputs $V_p$ and $V_m$. The circuit samples these low frequency asserted and de-asserted signal levels onto capacitors $C_{ma}$ 218, $C_{md}$ 220, $C_{pa}$ 222, and $C_{pd}$ 224 by sequencing control signals geta (get asserted) 226 and getd (get de-asserted) 228 thereby closing switches $S_3$ 248 and $S_5$ 252 when geta is asserted, and closing switches $S_4$ 250 and $S_6$ 254 when getd is asserted. The resulting voltages $V_{pa}$ and $V_{pd}$ are the asserted and de-asserted signal levels, respectively, stored on capacitors 222 and 224. Similarly, voltages $V_{ma}$ and $V_{md}$, which are stored on capacitors 218 and 220, respectively, are the asserted and de-asserted signal levels of the receiver input $V_m$.

DC offset correction is achieved through a closed loop calibration that begins after the capacitors have been charged to their respective values. $S_{on}$ 204 is first de-asserted, thus opening switches 200 and 202, and disconnecting the receiver circuit path from the data bus. Simultaneous assertion of geta 226 and getd 228 then places the average of the voltages stored on $C_{ma}$ 218 and $C_{md}$ 220, $[(V_{ma}+V_{md})/2]$, onto the negative terminal, $dline_m$ 246, and the average of the voltages stored on $C_{pa}$ 222 and $C_{pd}$ 224, $[(V_{pa}+V_{pd})/2]$, onto the positive terminal $dline_p$ 244. The differential signal produced when these averages are placed on the respective terminals represents the DC offset component of the input signal. The summer 230 subtracts a differential correction signal ($V_{op}-V_{om}$) from this input DC offset component.

The output of comparator 234 switches High or Low, depending on the output of summer 230 plus the buffer 232 and comparator 234 offsets. Control signal, dcal 242, is asserted upon de-assertion of $S_{on}$ 204 and subsequent assertion of geta 226 and getd 228, thus enabling up/down counter 236 on the rising edges of Clk_local 240. Up/down counter 236 increments or decrements the output correction voltage, ($V_{op}-V_{om}$), from DAC 238, thus forcing the comparator output voltage to balance. For example, if the comparator output is "HIGH", the output from DAC 238 will be altered in a direction to force the comparator "LOW", and vice versa. This method of comparing and incrementing or decrementing continues until convergence of the output from comparator 234 is achieved. A balanced output is thus obtained, and a final output pattern of alternating logic levels (e.g., 10101010) is acquired from comparator 234 due to up/down counter 236 alternately incrementing and decrementing output correction voltage ($V_{op}-V_{om}$) by 1 least significant bit (LSB) about the desired nulling value. The differential signal ($V_{op}-V_{om}$) will thus be stabilized and the total signal path offset will be corrected within the LSB of DAC 238.

Figure 5:
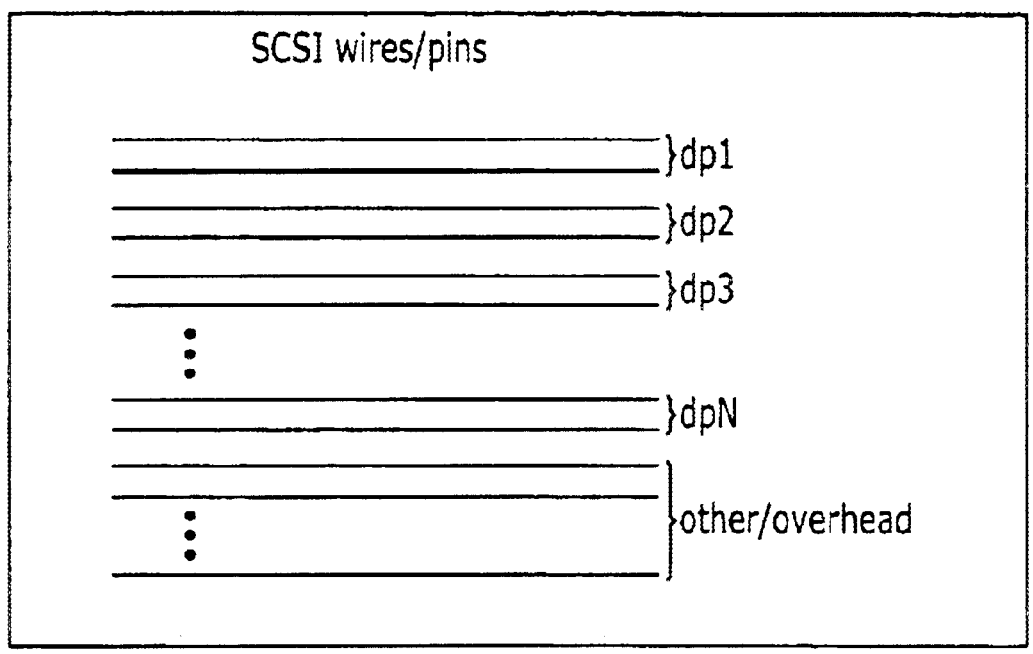
FIG. 5 is a schematic diagram of the wires or pins of a SCSI channel interface or of a SCSI parallel data bus as described in the illustrated embodiments.

FIG. 5 shows the pins provided as part of a given channel interface 405 or the wires of the cable to which a given channels interface is connected, such structure being known in the art for differential SCSI interfaces. As known in the art, differential SCSI interfaces carry plural signals simultaneously over wires connected in parallel. Each signal sent across the bus is carried by a respective pair of wires. The first wire in the pair carries one version of the signal, and the second wire carries the logical inversion of the signal carried by the first wire.

The SCSI interface connects computers and peripheral devices in a daisy-chain fashion. Each connected device receives and passes on signals on all wires of the SCSI cable to which it is connected.

Accordingly, as shown in FIG. 5, a plurality (N) of pairs of wires/pins is illustrated, including a first differential pair dp1, a second differential pair dp2, fourth through N-1 differential pairs (not shown), and an Nth differential pair dpN. Other wires/pins are also provided, e.g., to serve as a ground or to serve a particular overhead function. The position of those other wires/pins in FIG. 5 is not meant to indicate their actual position, rather only their existence in a given cable or channel interface.

The system described above offers a simple and accurate measure of the offset components of a received signal, including DC offsets due to terminator mismatches and interconnect resistance, and signal offsets due to driver asserted versus de-asserted level asymmetries. The offset detection is analog and therefore continuous. Correction resolution is limited by the resolution of the correction digital-to-analog converter and is not inherently limited by timing resolution. Further, the described offset circuitry is highly robust in a noisy environment. The sampling capacitors and their associated switches have low-pass characteristics; hence high frequency components (e.g., noise) at the receiver input are averaged or filtered during the capture process resulting in better DC offset estimates.

Still further, because a synchronous clock is not required for the dc offset correction circuitry, incoming data does not need to be aligned with the DC offset correction circuitry timing, except for the relatively non-critical timing alignment of the geta and getd sampling intervals with the low-frequency training pattern. The correction can be asserted at any time during the training pattern after the asserted and de-asserted samples are obtained.

In addition to correcting the input signal offset, this approach corrects the offset of other receiver circuit blocks, including the comparator.

Moreover, the offset correction method and circuitry is contained within the receiver and does not require feedback to other devices on the parallel data bus.

The foregoing description of embodiments of the present invention provides illustration and description, but is not intended to be exhaustive or to limit the invention to the precise form disclosed. In particular, the offset correction loop could use a binary search algorithm in place of the up/down counter, and the receiver signal path could include other circuit blocks in place of buffer 232 in FIG. 2. Modifications and variations are possible consistent with the above teachings. The claims and their equivalents define the scope of the invention.

What is claimed:

1. A circuit for reducing direct-current (DC) offset in a differential signal line pair, the circuit comprising:
    a first set of storage elements responsive to a first signal line of the differential signal line pair, and configured to generate a DC offset level indication for the first signal line;
    a second set of storage elements responsive to a second signal line of the differential signal line pair, and configured to generate a DC offset level indication for the second signal line;
    a switch circuit that is configured to selectively electrically connect and electrically isolate the first and second set of storage elements with the corresponding first and second signal lines based on a control signal; and
    an offset correction loop circuit that is configured to combine the DC offset level indications from the first and second set of storage elements and a DC offset correction signal, and that is configured to recursively modify the DC offset correction signal to reduce a difference between the DC offset correction signal and the DC offset level indications from the first and second set of storage elements while the switch circuit electrically isolates the first and second set of storage elements from the first and second signal lines, and that is configured to reduce DC offset in a signal from the differential signal line pair based on the DC offset correction signal.

2. The circuit of claim 1, wherein the offset correction loop circuit is configured to recursively modify the DC offset correction signal until the difference between the DC offset correction signal and the DC offset level indications from the first and second set of storage elements is stabilized, after which the switch circuit electrically connects the first and second set of storage elements and the corresponding first and second signal lines.

3. The circuit of claim 1, wherein the difference between the DC offset level indications from the first and second sets of storage elements represents a DC offset between the first and second signal lines.

4. The circuit of claim 3, wherein the first set of storage elements comprises:
    a first capacitor for storing a representation of an asserted signal level on the first signal line; and
    a second capacitor for storing a representation of a de-asserted signal level on the first signal line.

5. The circuit of claim 4, wherein the second set of storage elements comprises:
    a third capacitor for storing a representation of an asserted signal level on the second signal line; and
    a fourth capacitor for storing a representation of a de-asserted signal level on the second signal line.

6. The circuit of claim 1, wherein the offset correction loop circuit comprises:
    a summing circuit that is configured to combine the DC offset level indications from the first and second set of storage elements with the DC offset correction signal to generate a summation signal;
    a comparator that is configured to generate a binary output based on the summation signal;
    a counter that is configured to vary a count value based on the binary output of the comparator; and
    a digital-to-analog converter that is configured to convert the count value from the counter into the DC offset correction signal.

7. A method for reducing direct-current (DC) offset in differential signal line pair, the method comprising:
    generating a DC offset level indication for at least one signal line of the differential signal line pair;
    combining the DC offset level indication and a DC offset correction signal to generate a summation signal;
    recursively modifying a DC offset correction signal to reduce the summation signal using an offset correction loop that is electrically isolated from the at least one signal line of the differential signal line pair; and
    reducing DC offset in a signal from the differential signal line pair based on the DC offset correction signal.

8. The method of claim 7, wherein generating a DC offset level indication comprises sampling a signal line from a SCSI parallel data bus.

9. The method of claim 7, wherein the DC offset correction signal is recursively modified until the difference between the DC offset correction signal and the DC offset level indication has stabilized, and further comprising electrically connecting the first and second set of storage elements with the corresponding first and second signal lines after the difference between the DC offset correction signal and the DC offset level indication has stabilized.

10. The method of claim 7, wherein the DC offset level indication is generated based on an asserted signal level of the first signal line and based on a de-asserted signal level of the first signal line.

11. The method of claim 10, wherein the DC offset level indication represents a DC offset between a first and second signal line of the differential signal line pair.

12. The method of claim 11, wherein generating a DC offset level indication comprises:
storing an asserted signal level for a first signal line of the differential signal line pair capacitor; and
storing a de-asserted signal level for the first signal line of the differential signal line pair on a second capacitor.

13. The method of claim 12, wherein generating a DC offset level indication further comprises:
storing an asserted signal level for a second signal line of the differential signal line pair on a third capacitor; and
storing a de-asserted signal level for the second signal line of the differential signal line pair on a fourth capacitor.

14. A circuit for reducing direct-current (DC) offset in a differential signal line pair, the circuit comprising:
a first set of storage elements connected to a first signal line of differential signal line pair, the first set of storage elements storing charge from the first signal line indicating asserted and de-asserted states on the first signal line;
a second set of storage elements connected to a second signal line of the differential signal line pair, the second set of storage elements storing charge from the second signal line indicating asserted and de-asserted states on the second signal line;
a summing circuit connected to receive as input signals from the first and second set of storage elements and a differential offset correction signal, and to output a summation signal representing a summation of the signal from the first and second set of storage elements and the first differential offset correction signal;
a comparator connected to receive the differential summation signal and to generate a binary output indicating whether the differential summation signal contains a positive or negative de offset, the binary output being used to recursively modify the value of the differential offset correction signal until the offset correction signal stabilizes;
a binary counter connected to the binary output, the binary output controlling a counting direction of the binary counter; and
a digital-to-analog converter connected to the output of the binary counter, the digital-to-analog converter converting an output of the binary counter into the differential offset correction signal.

15. A circuit for reducing direct current (DC) offset in a differential signal line pair, the circuit comprising:
a sample and hold circuit that is configured to generate a DC offset level indication for at least one signal line of the differential signal line pair;
a switch circuit that is configured to selectively electrically connect and electrically isolate the sample and hold circuit and the at least one signal line of the differential signal line pair based on a control signal; and
an offset correction loop circuit that is configured to generate a DC offset correction signal based on the DC offset level indication while the switch circuit electrically isolates the sample and hold circuit from the at least one signal line of the differential signal line pair, and that is configured to reduce DC offset in a signal from the differential signal line pair based on the DC offset correction signal.

16. The circuit of claim 15, wherein the sample and hold circuit is configured to store a representation of an asserted signal level and a representation of a de-asserted signal level from the at least one signal line of the differential signal line pair, and is configured to combine the representation of the asserted signal level and the representation of the de-asserted signal level to generate the DC offset level indication.

17. The circuit of claim 16, wherein the sample and hold circuit comprises:
a first pair of storage elements connected to a first signal line of the differential signal line pair, wherein one of the first pair of storage elements is configured to store a representation of the asserted signal level, and wherein the other one of the first pair of storage elements is configured to store a representation of the de-asserted signal level; and
a second pair of storage elements connected to a second signal line of the differential signal line pair, wherein one of the second pair of storage elements is configured to store a representation of the asserted signal level, and wherein the other one of the second pair of storage elements is configured to store a representation of the de-asserted signal level, wherein the sample and hold circuit is configured to combine the representations of the asserted signal level and the representation of the de-asserted signal level of the first signal line to generate a DC offset level indication for the first signal line, and wherein the sample and hold circuit is configured to combine the representations of the asserted signal level and the representation of the de-asserted signal level of the second signal line to generate a DC offset level indication for the second signal line.

18. The circuit of claim 15, wherein:
the sample and hold circuit is configured to generate a DC offset level indication for each signal line of the differential signal line pair; and
the offset correction loop circuit comprises:
a summing circuit that is configured to combine the DC offset level indications for the signal lines of the differential signal line pair with the DC offset correction signal to generate a summation signal;
a comparator that is configured to generate a binary output based on the summation signal;
a counter that is configured to vary a count value based on the binary output of the comparator; and
a digital-to-analog converter that is configured to convert the count value from the counter into the DC offset correction signal.

19. The circuit of claim 15, wherein the offset correction loop is configured to recursively modify the DC offset correction signal to reduce the difference between the DC offset correction signal and the DC offset level indication while the switch circuit electrically isolates the sample and hold circuit from the at least one signal line of the differential signal line pair.

20. The circuit of claim 15, wherein the sample and hold circuit is configured to generate the DC offset level indication by sampling a line from a parallel data bus.

21. The circuit of claim 15, wherein the sample and hold circuit is configured to generate the DC offset level indication by sampling a line from a SCSI parallel data bus.

22. A method for reducing direct current (DC) offset in a differential signal line pair, the method comprising:

generating a DC offset level indication for at least one signal line of the differential signal line pair;

generating a DC offset correction signal based on the DC offset level indication using an offset correction loop that is electrically isolated from the at least one signal line of the differential signal line pair; and reducing DC offset in a signal from the differential signal line pair based on the DC offset correction signal.

23. The method of claim 22, wherein generating a DC offset level indication comprises:

storing a representation of an asserted signal level from the at least one signal line of the differential signal line pair;

storing a representation of a de-asserted signal level from the at least one signal line of the differential signal line pair; and combining the representations of the asserted and de-asserted signal levels to generate the DC offset level indication.

24. The method of claim 23, wherein generating a DC offset level indication comprises:

storing a representation of the asserted signal level from a first signal line of the differential signal line pair;

storing a representation of the de-asserted signal level from the first signal line of the differential signal line pair;

storing a representation of the asserted signal level from a second signal line of the differential signal line pair;

storing a representation of the de-asserted signal level from the second signal line of the differential signal line pair;

combining the representations of the asserted and de-asserted signal levels of the first signal line to generate the DC offset level indication for the first signal line; and combining the representations of the asserted and de-asserted signal levels of the second signal line to generate the DC offset level indication for the second signal line.

25. The method of claim 22, wherein:

generating a DC offset level indication comprises generating a DC offset level indication for each signal line of the differential signal line pair; and generating a DC offset correction signal comprises:

combining the DC offset level indications for the signal lines of the differential signal line pair with the DC offset correction signal to generate a summation signal; and changing the DC offset correction signal based on the summation signal.

26. The method of claim 25, wherein changing the DC offset correction signal comprises:

generating a binary signal based on the summation signal;

changing a count value based on the binary signal; and generating the DC offset correction signal from the count value.

* * * * *

UNITED STATES PATENT AND TRADEMARK OFFICE
CERTIFICATE OF CORRECTION

PATENT NO. : 6,794,920 B1
DATED : September 21, 2004
INVENTOR(S) : Aliahmad et al.

It is certified that error appears in the above-identified patent and that said Letters Patent is hereby corrected as shown below:

Column 7,
Line 19, should read -- differential signal line pair on a first capacitor; and --

Signed and Sealed this

Eighth Day of February, 2005

JON W. DUDAS
*Director of the United States Patent and Trademark Office*